United States Patent
Lai

(10) Patent No.: US 9,040,367 B2
(45) Date of Patent: May 26, 2015

(54) LATCH-UP IMMUNITY NLDMOS

(75) Inventor: Da-Wei Lai, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 312 days.

(21) Appl. No.: 13/590,561

(22) Filed: Aug. 21, 2012

(65) Prior Publication Data

US 2014/0054696 A1 Feb. 27, 2014

(51) Int. Cl.
*H01L 21/00* (2006.01)
*H01L 29/78* (2006.01)
*H01L 27/02* (2006.01)
*H01L 29/417* (2006.01)
*H01L 29/06* (2006.01)
*H01L 29/08* (2006.01)
*H01L 29/10* (2006.01)

(52) U.S. Cl.
CPC ....... *H01L 29/7816* (2013.01); *H01L 29/41775* (2013.01); *H01L 29/0653* (2013.01); *H01L 29/0696* (2013.01); *H01L 29/0878* (2013.01); *H01L 29/1087* (2013.01); *H01L 27/027* (2013.01)

(58) Field of Classification Search
USPC .......................... 438/163, 197, 286
See application file for complete search history.

(56) References Cited

U.S. PATENT DOCUMENTS

| | | | |
|---|---|---|---|
| 7,368,761 B1* | 5/2008 | Lai et al. ................ | 257/173 |
| 2013/0187218 A1* | 7/2013 | Lai et al. ................ | 257/328 |
| 2013/0187231 A1* | 7/2013 | Lai et al. ................ | 257/355 |
| 2014/0001549 A1* | 1/2014 | Bode et al. .............. | 257/337 |

OTHER PUBLICATIONS

Keppens et al., "ESD protection solutions for high voltage technologies", conference publication, pp. 1-10, Electrical Overstress/Electrostatic Discharge Symposium, 2004.

* cited by examiner

*Primary Examiner* — Matthew E Warren
(74) *Attorney, Agent, or Firm* — Ditthavong & Steiner, P.C.

(57) ABSTRACT

An improved nLDMOS ESD protection device having an increased holding voltage is disclosed. Embodiments include: providing in a substrate a DVNW region; providing a HVPW region in the DVNW region; providing bulk and source regions in the HVPW region; providing a drain region in the DVNW region, separate from the HVPW region; and providing a polysilicon gate over a portion of the HVPW region and the DVNW region.

8 Claims, 6 Drawing Sheets

US 9,040,367 B2

LATCH-UP IMMUNITY NLDMOS

TECHNICAL FIELD

The present disclosure relates to electrostatic discharge (ESD) protection devices. The present disclosure is particularly applicable to n-channel laterally diffused metal oxide semiconductor (nLDMOS) ESD protection devices for a high voltage LDMOS process.

BACKGROUND

An nLDMOS device is a common ESD protection device in high voltages processes. However, traditional nLDMOS devices suffer from latch-up due to inherently strong snapback characteristics. One traditional approach is to stack nLDMOS ESD devices to increase the holding voltage ($V_h$). However, this approach wastes substrate area, and reduces ESD protection performance.

FIG. 1 schematically illustrates a traditional nLDMOS device that suffers from latch-up due to inherently strong snapback characteristics. As shown, the device in FIG. 1 includes a p-type substrate 101 having a dual voltage n-well (DVNW) region 103, a high voltage p-well (HVPW) region 105 in the DVNW region 103, and a high voltage n-type double diffusion drain (HVNDDD) 107 in the HVPW region 105. Under an ESD condition, for instance, positive zapping from a drain region 109 to a source region 111, a device breakdown or trigger voltage ($V_t$) is reached, resulting in charges or holes going though HVPW region 105. Once reaching a trigger voltage, for instance point 113, a snapback to a $V_h$, for instance point 115, results. Point 113 may, for example, represent a $V_t$ of 34 volts (V), and point 115 may represent a $V_h$ of 9 V for a normal operation voltage of 24 V (or 30 V), resulting in a latch-up of the traditional nLDMOS device.

FIG. 2 illustrates characteristics of a traditional nLDMOS device. Once reaching $V_t$ 201, traditional nLDMOS devices will snapback to a $V_h$ 203 that is less than an operating voltage 205. As illustrated in FIG. 2, traditional devices latch-up due to the inherently strong snapback or base push-out characteristic.

A need therefore exists for an improved nLDMOS ESD protection device, having an increased $V_h$, resulting in non-snapback behavior, and an increased trigger current, and enabling methodology.

SUMMARY

An aspect of the present disclosure is a method including providing a drain region in a DVNW region, separate from a HVPW region.

Another aspect of the present disclosure is a device including a drain region in a DVNW region, separate from a HVPW region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: providing in a substrate a DVNW region; providing a HVPW region in the DVNW region; providing bulk and source regions in the HVPW region; providing a drain region in the DVNW region, separate from the HVPW region; and providing a polysilicon gate over a portion of the HVPW region and the DVNW region.

Aspects include providing in the DVNW region in the drain region an n-well (NW) region. Some aspects include providing a first N+ region in the NW region. Additional aspects include forming a silicided block layer on the first N+ region, a portion of the polysilicon gate, and the DVNW therebetween. Further aspects include providing in the source region in the HVPW region, second and third N+ regions and a first P+ region, the second and third N+ regions being separated by the first P+ region. Some aspects include: coupling the second and third N+ regions and the polysilicon gate to a ground rail; and coupling the first N+ region to an I/O pad. Additional aspects include: providing a second P+ region in the substrate, separate from the DVNW; and coupling the second P+ region to the ground rail. Further aspects include providing an ESD current path from the I/O pad to the ground rail through the NW, DVNW, HVPW, and third N+ regions during an ESD event.

An additional aspect of the present disclosure is a device including: a substrate; a DVNW region in the substrate; a HVPW region in the DVNW region; bulk and source regions in the HVPW; a drain region in the DVNW region, separate from the HVPW; and a polysilicon gate over a portion of the HVPW region and the DVNW region.

Aspects include an NW region in the DVNW region in the drain region. Some aspects include the device having no HVNDDD region. Additional aspects include a first N+ region in the NW region. Further aspects include a silicided block layer on the first N+ region, a portion of the polysilicon gate, and the DVNW therebetween. Some aspects include: second and third N+ regions in the HVPW region; and a first P+ region separating the second and third N+ regions. Additional aspects include: the second and third N+ regions and polysilicon gate being coupled to a ground rail; and the first N+ region being coupled to an I/O pad. Further aspects include a second P+ region in the substrate, separate from the DVNW region, the second P+ region being coupled to the ground rail.

Another aspect of the present disclosure is a device including: a p-type substrate; a first P+ region in the p-type substrate; a DVNW region in the p-type substrate, separate from the first P+ region; a first N+ region in the DVNW region; a first shallow trench isolation (STI) layer separating the first P+ region from the first N+ region; a HVPW region in the DVNW region, separate from the first N+ region; a second and third N+ region in the HVPW region; a second STI layer separating the first and second N+ regions; a second P+ region in the HVPW region separating the second and third N+ regions; a polysilicon gate on a portion of the HVPW region and on the DVNW region; a fourth N+ region in the DVNW region; and a silicided block layer on a portion of the polysilicon gate, the fourth N+ region, and the DVNW region therebetween; the first P+ region and second and third N+ regions being coupled to a ground rail, and the fourth N+ region being coupled to an I/O pad.

Aspects include an NW region in the DVNW region, the fourth N+ region being in the NW region. Further aspects include a third STI region in the DVNW region, between the fourth N+ region and the HVPW region, the polysilicon gate and silicided block layer overlying the third STI region. Additional aspects include the device having no HVNDDD region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of snap-back behavior in nLDMOS ESD protection devices, for instance static or transient latch-up, attendant upon an ESD event. The present disclosure addresses and solves such problems, for instance, by, inter alia, providing a drain region in a DVNW region, separate from a HVPW region, thereby forcing current to go through a vertical direction, not a horizontal direction under ESD zapping.

Methodology in accordance with embodiments of the present disclosure includes: providing in a substrate DVNW region; providing a HVPW region in the DVNW region; providing bulk and source regions in the HVPW region; providing a drain region in the DVNW region, separate from the HVPW region; and providing a polysilicon gate over a portion of the HVPW region and the DVNW region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
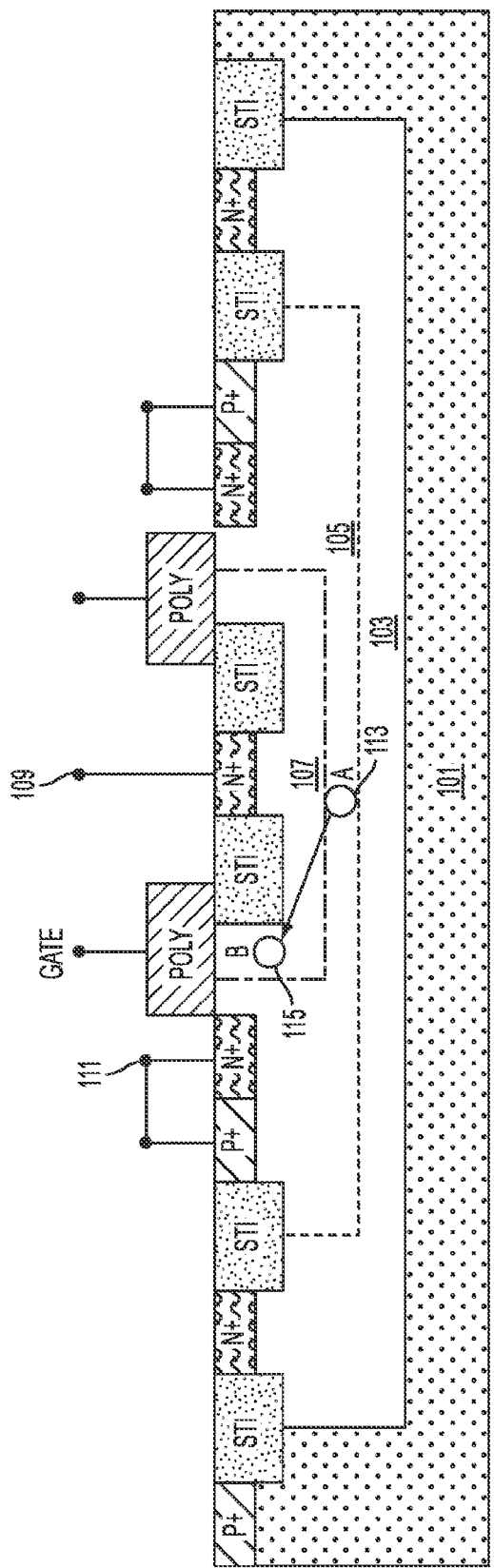
FIG. 1 schematically illustrates a traditional nLDMOS device.
Figure 2:
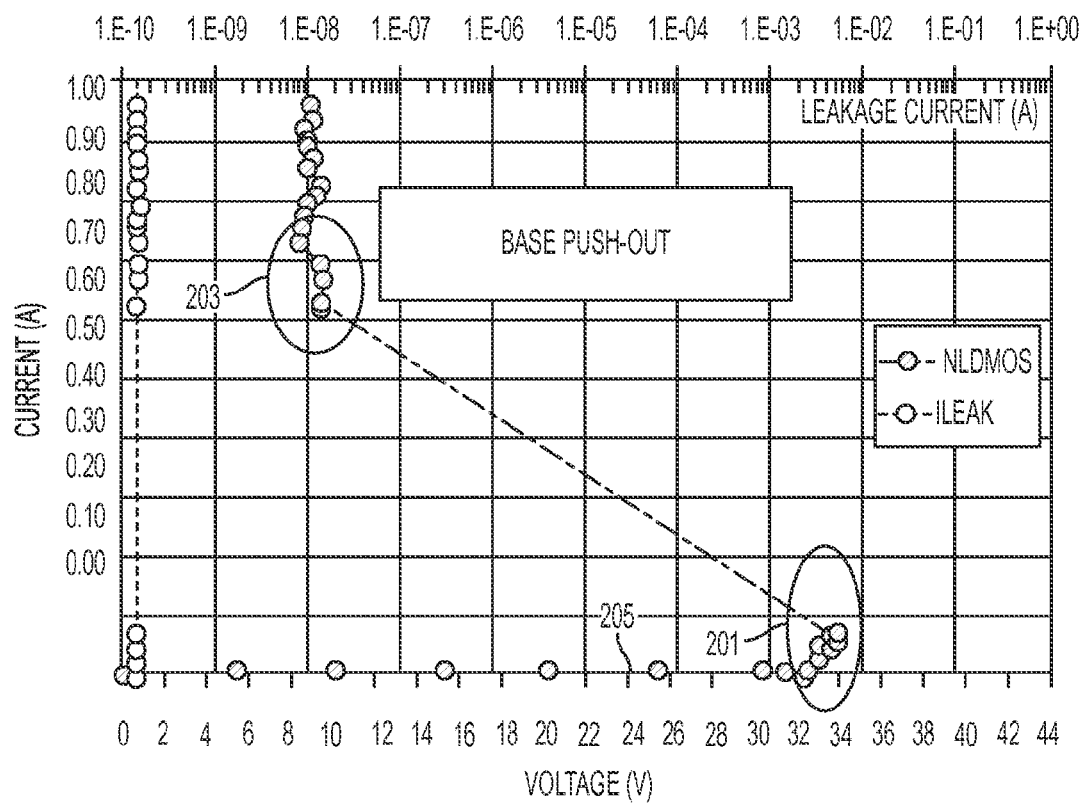
FIG. 2 illustrates characteristics of a traditional nLDMOS device.
Figure 3:
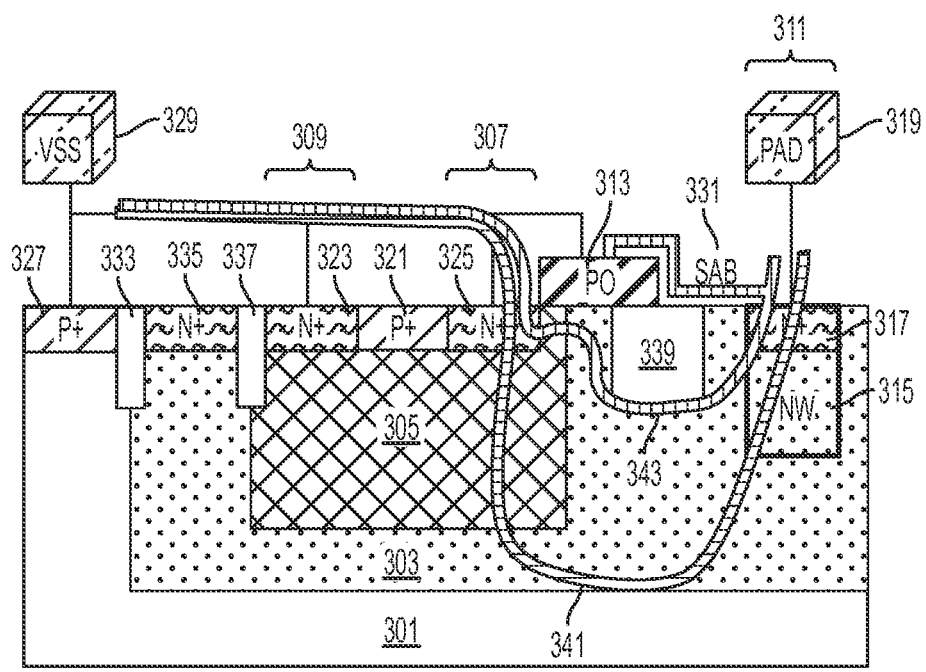
FIG. 3 schematically illustrates a half cross-sectional view of an improved nLDMOS ESD protection device, in accordance with an exemplary embodiment.
Figure 4:
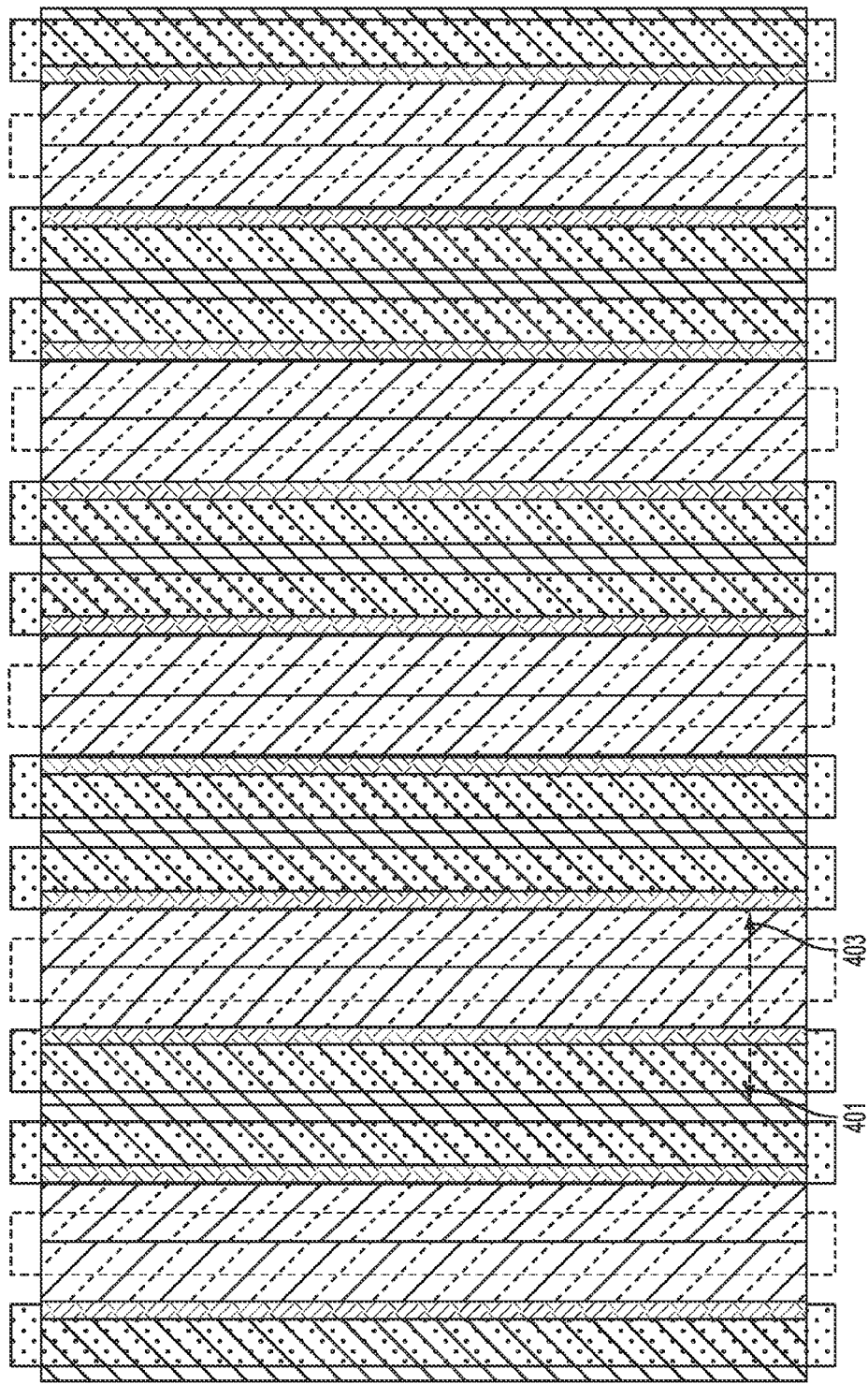
FIG. 4 schematically illustrates a layout view of an improved nLDMOS ESD protection device, in accordance with an exemplary embodiment.

FIG. 3 schematically illustrates a half cross-sectional view of an improved nLDMOS ESD protection device, in accordance with an exemplary embodiment, and FIG. 4 schematically illustrates a layout view in which the half cross-section view of the nLDMOS ESD protection device illustrated in FIG. 3 spans from point 401 to 403. The device area may, for example, be 80.36 microns (μm) by 52.58 μm. As shown, the device in FIG. 3 includes a p-type silicon substrate 301 having a DVNW region 303 and a HVPW region 305 in the DVNW region 303. The substrate 301 may be formed using conventional front-end-of-line (FEOL) steps. Additionally, a bulk region 307 and source region 309 are in the HVPW region 305 and a drain region 311 is in the DVNW region 303, separate from the HVPW region 305. Combining source and bulk regions 309 and 307 in HVPW region 305 results in improved substrate resistance ($R_{sub}$) control and a reduced device (or circuit) size. Further, a polysilicon gate 313 is over a portion of the HVPW region 305 and the DVNW region 303. As shown, the drain region 311 may include an NW region 315 in the DVNW region 303. As illustrated in FIG. 3, the device includes no HVNDDD region, (e.g., HVNDDD region 107 from the traditional nLDMOS device).

The device further includes a first N+ region 317 in the NW region 315 coupled to an I/O pad 319, a first P+ region 321 separating a second N+ region 323 and a third N+ region 325 in the HVPW region 305, and a second P+ region 327 in the substrate 301, separate from the DVNW region 303. The second and third N+ regions 323 and 325, the polysilicon gate 313, and the second P+ region 327 are coupled to a ground rail 329. Additionally, as shown, a silicided block layer 331 is on the first N+ region 317, a portion of the polysilicon gate 313, and the DVNW region 303 therebetween. Further, a first STI region 333 separates the second P+ region 327 from a fourth N+ region 335 in the DVNW region 303, a second STI region 337 separates the fourth and second N+ regions 335 and 323, and a third STI region 339 is located in the DVNW region 303 between the first N+ region 317 and the HVPW region 305, with the polysilicon gate 313 and silicided block layer 331 overlying the third STI region 339. An ESD current path 341 goes through a vertical direction from the I/O pad 319 to the ground rail 329 through the NW region 315, the DVNW region 303, the HVPW region 305, and the third N+ region 325 during an ESD event.

The device shown in FIG. 3 is configured to provide ESD current path 341 rather than current path 343 in order to improve snapback characteristics of the resulting device and to achieve higher trigger current under ESD testing from I/O pad 319 to ground rail 329 with positive zapping. For instance, NW region 315 may be added or increased in size. Additionally or alternatively, the HVPW region 305 may be increased in size.

Figure 5:
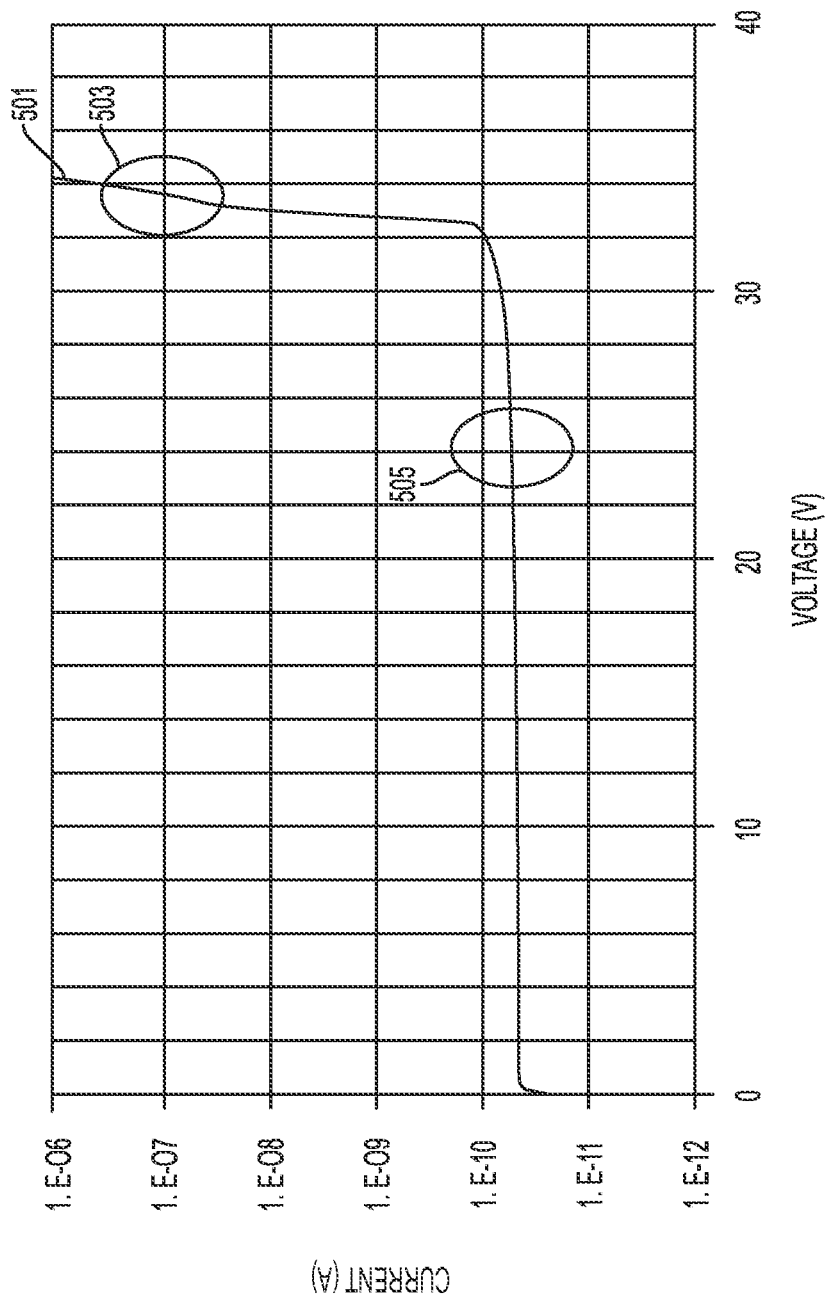
FIG. 5 illustrates DC reverse breakdown characteristics of an improved nLDMOS ESD protection device, in accordance with an exemplary embodiment.

FIG. 5 illustrates DC reverse breakdown characteristics of an improved nLDMOS ESD protection device. A current sweep 501 from, for instance, I/O pad 319 to ground rail 329 shows a DC reverse breakdown ($V_{bd}$) 503 of about 34 volts, resulting in ESD protection that will not affect normal operation in a process having a 24 V normal operating voltage 505.

Figure 6:
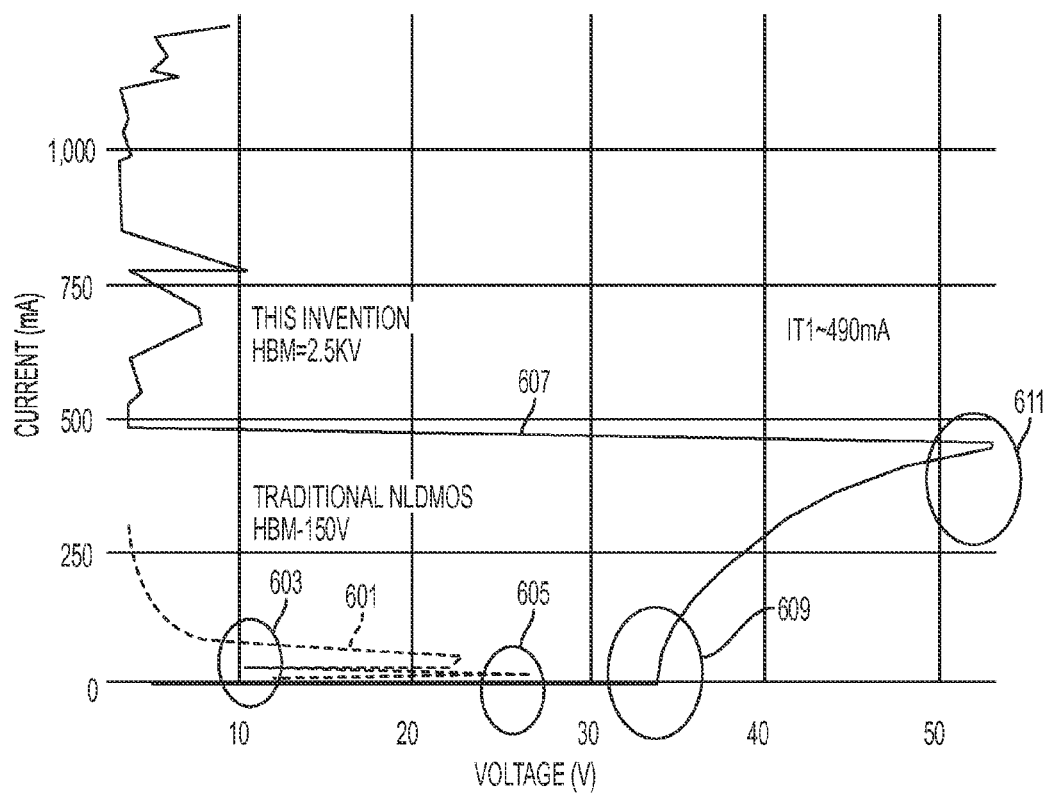
FIG. 6 illustrates a comparison of DC characteristics of a traditional nLDMOS device and an improved nLDMOS ESD protection device.

FIG. 6 illustrates a comparison of DC characteristics of a traditional nLDMOS device and an improved nLDMOS ESD protection device. The traditional nLDMOS response 601 shows a latch-up behavior due to a $V_h$ 603 less than a maximum normal operating voltage 605, for instance 110% of the normal operating voltage (e.g., 1.1 times 24 V, or 26.4 V). On the other hand, response 607 of an improved nLDMOS ESD protection device (e.g., the device shown in FIG. 3) shows non-latch-up behavior, due to a $V_h$ 609 of 34 V, which is higher than the maximum normal operating voltage 605. Another improved characteristic of response 607 compared to response 601 is the trigger current 611 for the response 607 is increased to 490 milliamps (mA), resulting in compliance with, for instance, general static and transient latch-up specifications. Further, since the general human body mode specification (HBM) is 2.0 kilovolts (kV), the response 607 has an improved ESD performance over the response 601, for instance, a 2.5 kV HBM ESD performance compared to a 150 V HBM ESD performance for the traditional nLDMOS.

The embodiments of the present disclosure can achieve several technical effects, including non-snapback behavior, an increased trigger current, increased holding voltage, design simplicity, reduced device (or circuit) size, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any device utilizing logic or high-voltage technology nodes. The present disclosure therefore enjoys industrial applicability in any of various types of highly integrated semiconductor devices, including logic or high voltage technology nodes from mainstream to advanced devices that use ESD protection devices to pass ESD/Latch-up standards specifications (e.g., liquid crystal display (LCD) drivers, synchronous random access memories (SRAM), One Time Programming (OTP), power management products, etc.).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
 providing in a substrate a dual voltage n-well (DVNW) region;
 providing a high voltage p-well (HVPW) region in the DVNW region;
 providing bulk and source regions in the HVPW region;
 providing a drain region in the DVNW region, separate from the HVPW region;
 providing a polysilicon gate over a portion of the HVPW region and the DVNW region; and
 providing in the source region in the HVPW region, second and third N+ regions and a first P+ region, the second and third N+ regions being separated by the first P+ region.

2. The method according to claim 1, comprising:
 providing in the DVNW region in the drain region an n-well (NW) region.

3. The method according to claim 2, comprising:
 providing a first N+ region in the NW region.

4. The method according to claim 3, comprising:
 forming a silicided block layer on the first N+ region, a portion of the polysilicon gate, and the DVNW therebetween.

5. The method according to claim 1, comprising:
 coupling the second and third N+ regions and the polysilicon gate to a ground rail; and
 coupling the first N+ region to an I/O pad.

6. The method according to claim 5, further comprising:
 providing a second P+ region in the substrate, separate from the DVNW region; and
 coupling the second P+ region to the ground rail.

7. The method according to claim 6, comprising:
 providing an ESD current path from the I/O pad to the ground rail through the NW, DVNW, HVPW, and third N+ regions during an ESD event.

8. The method according to claim 1, wherein the first P+ region and the second N+ region abut each other, having no other element therebetween.

* * * * *